United States Patent [19]

Carter

[11] 4,381,496

[45] Apr. 26, 1983

[54] ANALOG TO DIGITAL CONVERTER

[75] Inventor: Ernest A. Carter, Austin, Tex.

[73] Assignee: Motorola, Inc., Schaumburg, Ill.

[21] Appl. No.: 202,953

[22] Filed: Nov. 3, 1980

[51] Int. Cl.³ .......................................... H03K 13/02
[52] U.S. Cl. ..................... 340/347 AD; 340/347 DA; 340/347 CC
[58] Field of Search ............... 340/347 AD, 347 DA, 340/347 CC; 324/99 D

[56] References Cited

U.S. PATENT DOCUMENTS

| | | | |
|---|---|---|---|
| 3,568,179 | 3/1971 | Lampkin | 340/347 AD |
| 3,653,030 | 3/1972 | Carbrey | 340/347 AD |
| 3,656,152 | 4/1972 | Gundersen | 340/347 AD |

OTHER PUBLICATIONS

Redfern, "IEEE International Solid-State Circuits Conference", Feb. 15, 1979, pp. 176-177 and 292.
Fotouhi, "IEEE International Solid-State Circuits Conference", Feb. 15, 1979, pp. 186-187.

Primary Examiner—C. D. Miller
Attorney, Agent, or Firm—Anthony J. Sarli, Jr.; Vincent B. Ingrassia; Jeffrey Van Myers

[57] ABSTRACT

A successive-approximation charge-redistribution analog-to-digital converter includes a binary weighted capacitive ladder for converting the least significant bits of the binary output representation and a resistive ladder for converting the higher order bits of the output representation. To achieve a half least significant bit shift, the capacitor of lowest capacitance in the ladder having a capacitance C is replaced by first and second capacitors each having a capacitance C/2. Each of these capacitors has a first terminal connected to the input of a comparator. Another input of the first capacitor is coupled to the low reference voltage. The second input of the second capacitor is coupled to one-eighth the high reference voltage during the sample phase and to the low reference voltage when the sample phase is completed. The resulting redistribution of charge which occurs at the input to the comparator is equivalent to minus one-half times the charge corresponding to one least significant bit. Thus, the stored sample to be converted is reduced in voltage by one-half least significant bit.

2 Claims, 3 Drawing Figures

ANALOG TO DIGITAL CONVERTER

BACKGROUND OF THE INVENTION

1. Field of the Invention

This invention relates generally to successive-approximation analog-to-digital (A/D) converters and, more particularly, to a metal-oxide-semiconductor (MOS) charge redistribution, successive-approximation A/D converter utilizing a half least significant bit shift.

2. Description of the Prior Art

Successive approximation analog-to-digital conversion is well known. For example, see U.S. Pat. Nos. 3,964,061; 3,949,395; 3,603,970; and 3,581,304. It involves the repeated division of the voltage range in half. In a three-bit system, for example, the system will first try 100 (half scale). Next, the system will try 010 (quarter scale) or 110 (three-quarter scale) depending on whether the first approximation was too large or too small. After three approximations, a three-bit representation of the unknown analog voltage is resolved. A more detailed discussion of successive approximation A/D converters may be found in *Integrated Electronics: Analog and Digital Circuits and Systems*, McGraw-Hill, Inc., 1972, page 667.

It is also known to use a sample-and-hold circuit in conjunction with an A/D converter. A capacitor (or capacitors) is charged with the unknown analog input voltage during a sample phase and retains the value during the conversion phase. The holding time is the length of time the circuit can hold a charge without dropping more than a specified percentage of its initial value. For an additional discussion of such circuits, see *The Logic Handbook*, Digital Equipment Corp., 1967 Edition, page 281.

Charge redistribution approaches to A/D conversion are known; e.g. U.S. Pat. No. 4,065,766. Further, the use of binary weighted capacitors is known; e.g. U.S. Pat. No. 3,836,906. In one known A/D conversion arrangement, a plurality of binary weighted capacitors are each charged by an unknown analog input signal. The common output of each of the capacitors is coupled to the input of a chopper stabilized comparator (a plurality of inverters each separated by capacitor) which, during the sample phase, is caused to assume an input voltage which is equal to its threshold voltage; i.e. a small variation at its input will cause the comparator output to switch. After the sample phase, the input to the comparator is left floating, i.e., no DC paths. Thereafter, signals from a successive approximation register are used to control a plurality of field-effect-transistor (FET) couplers to couple each of the binary weighted capacitors to either the high reference voltage (VRH, typically five volts in an NMOS system) or to a low reference voltage (VRL, typically ground). The analog input voltage, which may be as high as VRH, requires field-effect-transistor couplings to each of the capacitors.

It should be appreciated, that to pass either the analog input voltage or the high reference voltage to the various coupling field-effect-transistor coupling switches, it is necessary that the enabling voltage placed on the gate electrodes of the couplers be higher than the sum of the voltages being passed plus the FET threshold voltage. In a system in which the analog input voltage may be as high as the circuit supply voltage, a voltage boost circuit would be required in each case to achieve the required gate electrode voltages.

A second problem associated with the known circuit resides in the fact that a field-effect-transistor coupler has its current conducting path connected across the input and output of the comparator. When the high reference voltage is five volts and the low reference voltage is zero volts, and assuming an unknown analog input signal of five volts, the balanced comparator input node voltage (the comparator threshhold voltage) is typically two volts or less. Sampling is done on all binary weighted capacitors, and the first approximation connects the largest capacitor to VRH and all others to VRL. That is, the first approximation is 2.5 volts. Assuming neglible attenuation through the capacitors, the resulting redistribution of charge causes the comparator input voltage to drop by 2.5 volts (the analog input voltage minus the first approximation voltage), resulting in a voltage at the input of the comparator of minus 0.5 volts. This, however, tends to turn on the field-effect-transistor coupler across the first stage of the comparator causing leakage to occur at the comparator input node. Since the charge stored on this node is in essence the stored sample, accuracy is lost.

One analog-to-digital converter of the successive approximation type which solves the above described problems is described in U.S. patent application Ser. No. 148,097 filed May 9, 1980 and entitled "Analog-to-Digital Converter." In this system, an unknown analog input voltage is sampled only on the largest capacitor of a binary weighted capacitive ladder network. The conversion phase proceeds utilizing all the capacitance and only one half the reference voltage. The circuit requires only a single voltage boost circuit of the type described in U.S. Pat. No. 4,346,310 entitled "Voltage Booster Circuit." This A/D converter, however, suffers from the following disadvantage. As the unknown input voltage varies linearly, the digital output from the A/D converter is a step function. There are very few points on the step function which are coincident with the unknown input voltage, as indicated in FIG. 1A. In actuality, the digital output voltage contains an average error equivalent to one-half bit and a maximum error equivalent to one bit. This error is referred to as quantization error.

A successive-approximation analog-to-digital converter technique utilizing a hybrid resistor string and capacitor array is described in the *International Solid State Circuits Conference Digest*, 1979, pages 186–187. The resistive ladder is used to subdivide the voltage range from a high reference voltage (VRH) to a low reference (VRL). The most significant bits of the converted output are obtained using the resistors in a manner similar to the standard resistive string A/D method; i.e. determining the voltage subdivision which brackets the unknown voltage. The low order bits are then determined by a charge redistribution method using binary weighted capacitors. However, rather than using VRH and VRL in the low order phase, the voltages references used are the two voltages from the resistor string determined in the previous phase to bracket the unknown voltage. This circuit also suffers from the disadvantage of having a relatively high quantization error in the digital output representation of the unknown analog input voltage.

SUMMARY OF THE INVENTION

It is an object of the present invention to provide an improved A/D converter.

It is a further object of the present invention to provide a successive approximation A/D converter which shifts the output by one-half of a least significant bit to increase accuracy by reduction of the quantization error.

This is accomplished without varying the uniformity of the resistors or adding extra capacitors to the comparator input, as has been done in various prior art systems.

According to one aspect of the invention there is provided a successive-approximation analog-to-digital converter for producing a binary representation of an unknown analog input voltage by comparing a sample of said analog input voltage with predetermined portions of a reference voltage comprising: first means for storing a sample of said analog input voltage during a sample phase; second means coupled to said first means for reducing the voltage of said sample by an amount substantially equal to one-half the amount represented by one least significant bit of said binary representation to produce a reduced sample; and third means coupled to said first means for converting said reduced sample to said binary representation.

According to a further aspect of the invention, there is provided a method for converting an unknown analog input voltage into a digital representation thereof using a successive approximation technique, comprising: storing a sample of said analog input voltage; reducing the voltage of said sample by an amount substantially equal to one-half the voltage represented by a least significant bit of said binary representation; and converting the reduced sample to said binary representation.

The above and other objects, features and advantages of the present invention will be more clearly understood from the following detailed description taken in conjunction with the accompanying drawings, in which:

DESCRIPTION OF THE PREFERRED EMBODIMENT

Figure 1A:
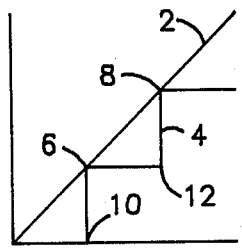
FIGS. 1A and 1B illustrate in graphical form the problem associated with some prior art successive approximation A/D converters and the solution offered by the present invention.

FIG. 1A illustrates graphically the disadvantage suffered by the prior art systems. Line 2 represents a linearly varying unknown analog input voltage, and step function 4 illustrates the output of prior art A/D converters. As can be seen, there are only a few points at which there is no quantization error; e.g. points 6 and 8. At other points, (e.g. points 10 and 12) the error may be as high as a full least significant bit. As should be apparent, the average quantization error is equivalent to one-half bit.

Figure 1B:
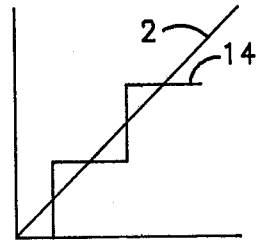

By employing the present invention, the least significant bit may be shifted by one-half bit resulting in the step function 14 shown in FIG. 1B. Now, the maximum error is plus or minus one-half bit while the average error is zero.

Figure 2:
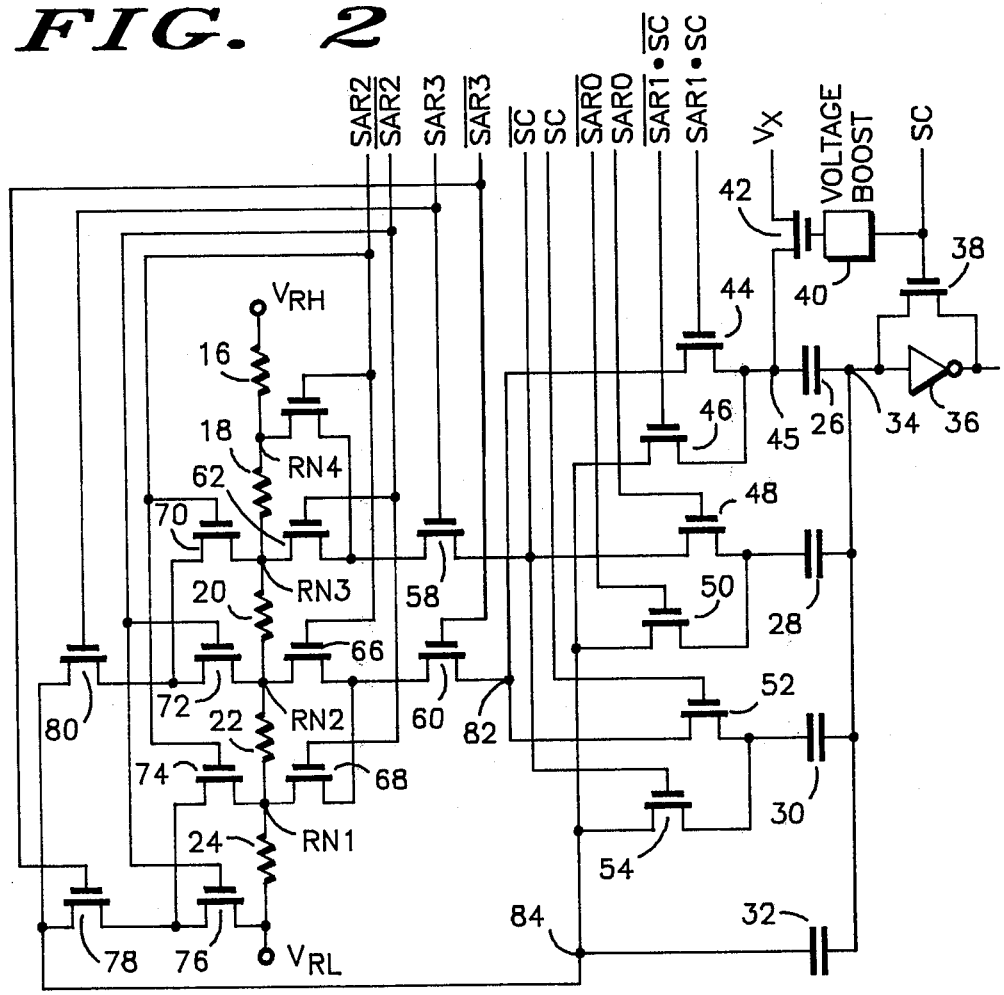
FIG. 2 is a schematic diagram of the inventive A/D converter.

FIG. 2 is a schematic diagram illustrating the inventive A/D converter. A resistive ladder or string including resistors 16, 18, 20, 22 and 24 subdivide the voltage range between the high reference (VRH) and the low reference (VRL). The high order (most significant) bits of the conversion are obtained using the resistors in a manner similar to the standard resistive ladder A/D method; i.e. determining the voltage subdivision which brackets the unknown voltage. The low order bits of the conversion are then determined using a charge redistribution method using binary weighted capacitor array 26, 28, 30 and 32 where capacitor 28 has unity capacitance, capacitor 26 has twice the unity capacitance, and capacitors 30 and 32 each have one-half unity capacitance.

Each of capacitors 26, 28, 30 and 32 is coupled at a first terminal thereof to node 34 at the input of inverter 36 which is the first stage of the comparator. It should be understood that while additional comparator stages may be employed, only one such stage is shown for clarity. In addition, more binary weighted capacitors or more resistors could be employed to obtain higher resolution.

A sample control signal (SC) is applied to the gate electrode of a first field-effect-transistor 38 having its source-drain path coupled so as to short the input and output of inverter 36 as shown. The sample control signal is also applied to a voltage boost circuit 40 the output of which is coupled to the gate electrode of a second field-effect-transistor 42 which, when turned on, couples an unknown analog input signal (VX) to a second terminal of capacitor 26 (node 44). While many voltage boost circuits are known and suitable for this purpose, a detailed description of one such circuit may be found in co-pending U.S. Pat. No. 4,346,310 and assigned to the assignee of the present invention.

Signals SAR0, SAR1, SAR2 and SAR3 are signals generated by a successive approximation register (not shown) which turns on selected field-effect-transistor couplers shown in FIG. 2 so as to control the voltage which is compared by the comparator with the stored sample. For example, if SAR3 is high and the remaining bits of the successive approximation register are low and if the sample phase has been concluded ($\overline{SC}$ is high), then couplers 46, 50, 54, 58, 64, 68, 72, 76 and 80 are turned on. Thus, each of capacitors 26, 28, 30 and 32 are coupled to resistor node RN2. If this voltage should be higher than the stored sample voltage, SAR3 will be reset and SAR2 set.

With SAR2 set and the remaining bits reset, couplers 46, 50, 54, 60, 62, 66, 70, 74 and 78 will be turned on. Thus, each of capacitors 26, 28, 30 and 32 will be coupled to resistor node RN1. If this voltage should turn out to be too high, SAR2 will be reset and SAR1 set. With SAR1 set, and the remaining SAR bits reset, couplers 44, 50, 54, 60, 64, 68, 72, 76, and 78 will be turned on. Thus, capacitor 26 will be coupled to resistor node RN1 and capacitors 28, 30 and 32 will be coupled to the low reference voltage VRL.

Finally, with SAR0 set and the remaining SAR bits reset, couplers 46, 48, 54, 60, 64, 68, 72, 76 and 78 will be turned on whereby capacitors 26, 30 and 32 are coupled to the low reference voltage VRL and capacitor 28 is coupled to resistor RN1.

It should be understood that each cycle of the successive approximation comparison will result in a decision as to whether or not the applied voltage is greater or less than the stored sample. If the applied voltage is greater than the stored sample, the corresponding successive approximation register bit will be reset. However, if the applied voltage is less than the stored sample, the corresponding successive approximation register bit will remain set during subsequent comparisons of lower significant bits.

From the above description, it can be seen that the states of SAR2 and SAR3 cause a particular resistor segment to be selected causing the voltage at the upper segment node to be coupled to node 82 and the voltage at the lower segment node to be coupled to node 84. These voltages are the references used during the conversion of the two lower order bits. Capacitor 28 which is the least significant bit capacitor is controlled by SAR0. During the conversion phase, when SAR0 changes from a 0 to a 1, there is a change in the voltage applied to capacitor 28 equivalent to (VRH−VRL)/8 or VRH/8 if VRL=0. The resulting charge differential corresponding to one least significant bit is thus VRH·C/8 where C represents unity capacitance.

The one-half least significant bit shift is accomplished by providing capacitors 30 and 32 each of one-half unity capacitance. While capacitor 32 is coupled to VRL whenever SAR2 and SAR3 are low, capacitor 30 is coupled to node 82 when the sample control signal (SC) is high, and is coupled to node 84 whenever the sample control signal is low, i.e. during the conversion phase.

The control logic which controls the SAR register must render SAR0, SAR2 and SAR3 low during the sample phase. Under these conditions, it can be seen that node 84 is coupled to VRL and node 82 is coupled to an offset voltage developed on resistor node RN1 which is one-eighth VRH if VRL equals zero.

At the conclusion of the sample phase, sample control signal SC goes low turning off coupler 38 in the first stage of the comparator thus causing the input node 34 to float. Further, capacitor 30 is disconnected from node 82 and is connected to node 84. This represents a voltage change equivalent to minus VRH/8 if VRL is 0. The resulting redistribution of charge which occurs at node 34 due to this change in voltage on capacitor 30 equals (−VRH/8)·(C/2) or −VRH·C/16. This change is minus one-half times the charge corresponding to one least significant bit. As a result of this change, the stored sample of the unknown analog signal to be converted (i.e., the charge stored at the comparator input node at the end of the sample phase) is reduced by one-half least significant bit compared to what it would be if both capacitors 30 and 32 were coupled directly to node 84 as is the case in prior art arrangements.

The above described approach for obtaining the half least significant bit shift does not require the addition of any extra capacitance to the input of the comparator since during the conversion phase it is only necessary that a capacitance equal to unity capacitance be connected to node 84 for proper A/D conversion. Capacitors 30 and 32, each equivalent to one-half unity capacitance, provide the required total. Any undesireable attenuation of the comparator input signal is avoided.

The above description is given by way of example only, changes in form and details may be made by one skilled in the art without departing from the scope of the invention as defined by the appended claims.

I claim:

1. A successive-approximation analog-to-digital converter comprising:

comparator means for producing an output in response to an input thereto exceeding a predetermined threshold voltage;

a plurality of binary weighted capacitors, including first and second one-half unit capacitors comprising a unit capacitance, each of the capacitors having a first terminal coupled in common to the input of the comparator means, and a second terminal;

voltage reference means for producing at least first and second predetermined reference voltages, and an offset voltage having a predetermined value between the first and second reference voltages;

sample means, operative during a sample phase, for storing a sample of an unknown analog input voltage on the largest of the capacitors while shorting the comparator means, and for simultaneously coupling the second terminals of each of the other capacitors except the first one-half unit capacitor to the first reference voltage while coupling the second terminal of the first one-half unit capacitor to the offset voltage; and successive-approximation means, operative during a conversion phase following said sample phase, for converting said sample to a binary representation thereof by successively coupling the second terminals of the capacitors, from the largest to the smallest, to the second reference voltage, and, in response to each such coupling which produces the output from the comparator means, recoupling such second terminal to the first reference voltage.

2. An analog-to-digital converter according to claim 1 wherein the successive-approximation means are further characterized as successively coupling the second terminals of each of the capacitors except the second one-half unit capacitor, from the largest to the smallest, to the second reference voltage, and, in response to each such coupling which produces the output from the comparator means, recoupling such second terminal to the first reference voltage.

* * * * *